US012663719B2

(12) United States Patent
Ogata et al.

(10) Patent No.: US 12,663,719 B2
(45) Date of Patent: Jun. 23, 2026

(54) RESIST UNDERLAYER FILM-FORMING COMPOSITION

(71) Applicant: NISSAN CHEMICAL CORPORATION, Tokyo (JP)

(72) Inventors: Hiroto Ogata, Toyama (JP); Tomotada Hirohara, Toyama (JP); Hirokazu Nishimaki, Toyama (JP); Makoto Nakajima, Toyama (JP)

(73) Assignee: NISSAN CHEMICAL CORPORATION, Tokyo (JP)

(*) Notice: Subject to any disclaimer, the term of this patent is extended or adjusted under 35 U.S.C. 154(b) by 1105 days.

(21) Appl. No.: 17/607,254

(22) PCT Filed: May 14, 2020

(86) PCT No.: PCT/JP2020/019179
§ 371 (c)(1),
(2) Date: Oct. 28, 2021

(87) PCT Pub. No.: WO2020/235427
PCT Pub. Date: Nov. 26, 2020

(65) Prior Publication Data

US 2022/0229368 A1 Jul. 21, 2022

(30) Foreign Application Priority Data

May 22, 2019 (JP) ................................ 2019-095886

(51) Int. Cl.

| | |
|---|---|
| ***G03F 7/11*** | (2006.01) |
| ***C08G 59/62*** | (2006.01) |
| ***C09D 163/00*** | (2006.01) |
| ***H10P 76/20*** | (2026.01) |

(52) U.S. Cl.
CPC .............. *G03F 7/11* (2013.01); *C08G 59/625* (2013.01); *C09D 163/00* (2013.01); *H10P 76/2043* (2026.01)

(58) Field of Classification Search
CPC ....... G03F 7/11; C08G 59/625; C09D 163/00; H01L 21/0276
See application file for complete search history.

(56) References Cited

U.S. PATENT DOCUMENTS

| | | | | |
|---|---|---|---|---|
| 2004/0241577 | A1 | 12/2004 | Hatakeyama et al. | |
| 2010/0068649 | A1* | 3/2010 | Senzaki ................. | G03F 7/038 430/280.1 |
| 2018/0284614 | A1 | 10/2018 | Satoh et al. | |
| 2018/0284615 | A1 | 10/2018 | Nagai et al. | |
| 2020/0183282 | A1 | 6/2020 | Hashimoto et al. | |

FOREIGN PATENT DOCUMENTS

| | | | |
|---|---|---|---|
| JP | 2004-354554 | A | 12/2004 |
| JP | 2014-174428 | A | 9/2014 |
| JP | 2018-173520 | A | 11/2018 |
| TW | 201842421 | A | 12/2018 |
| WO | 2012/105648 | A1 | 8/2012 |
| WO | 2018/052130 | A1 | 3/2018 |

OTHER PUBLICATIONS

Jun. 30, 2020 Search Report issued in International Patent Application No. PCT/JP2020/019179.
Nov. 16, 2021 International Preliminary Report on Patentability issued in International Patent Application No. PCT/JP2020/019179.

* cited by examiner

*Primary Examiner* — Walter H Swanson
(74) *Attorney, Agent, or Firm* — Oliff PLC

(57) ABSTRACT

A resist underlayer film forming composition wherein a flat film forms exhibiting high etching resistance, a good dry etching rate ratio and optical constant, has good coverage, and a small difference in film thickness after embedding. Also included are a resist underlayer film using the resist underlayer film forming composition; and a method for producing a semiconductor apparatus. This resist underlayer film forming composition includes: at least one compound of formula (A); at least one polymer of formula (B); and a solvent. (In formula (A), X represents a C2-C50 n-valent organic group, and n Y's represent a C6-C60 aromatic hydrocarbon group having at least one hydroxyl group, n represents an integer of 1-4.) [In formula (B), R1 represents a hydrogen atom or methyl group, and R2 represents at least one group from formulae (B-1) to (B-3). (In formulae (B-1) to (B-3), * represents a bond with an adjacent oxygen atom.)]

10 Claims, No Drawings

RESIST UNDERLAYER FILM-FORMING COMPOSITION

TECHNICAL FIELD

The present invention relates to a resist underlayer film-forming composition, which permits formation of a flat film that exhibits high etching resistance, excellent dry etching rate ratio, and excellent optical coefficient, and which has such excellent coverage for the so-called stepped substrate that the resultant film has a reduced difference in the thickness after filling; a resist underlayer film using the resist underlayer film-forming composition; and a method for producing a semiconductor device.

BACKGROUND ART

In recent years, the materials for a resist underlayer film for use in a multilayer resist process have been required to function as an antireflection film, particularly in the exposure using a light having a short wavelength, and to have an appropriate optical coefficient as well as an etching resistance in processing the substrate. And the use of a polymer having repeating units containing a benzene ring has been proposed (Patent Literature 1).

CITATION LIST

Patent Literature

Patent Literature 1: JP 2004-354554 A

SUMMARY OF INVENTION

Technical Problem

As the resist pattern is becoming finer, a resist layer having a reduced thickness is required, and, as a method for meeting the requirement, there has been known a lithography process, in which at least two layers of a resist underlayer film are formed, and the resist underlayer film is used as a mask material. This process is a method, in which at least one layer of an organic film (lower-layer organic film) and at least one layer of an inorganic lower-layer film are formed on a semiconductor substrate, the inorganic lower-layer film is patterned using the resist pattern formed in the upper-layer resist film as a mask, and the lower-layer organic film is patterned using the resultant pattern as a mask. This method is considered to be able to form a pattern having a high aspect ratio. Examples of materials for forming the at least two layers include combinations of an organic resin (e.g., an acrylic resin or a novolak resin) and an inorganic material (such as a silicon resin (e.g., an organopolysiloxane) or an inorganic silicon compound (e.g., SiON or $SiO_2$)). Further, recently has widely been used a double patterning technique, in which, for obtaining a single pattern, lithography is conducted twice and etching is conducted twice, and the above-mentioned multilayer process is used in each step. In this technique, the organic film formed following the formation of a first pattern is required to have properties such that the organic film planarizes the stepped surface.

However, the above-mentioned technique has a problem in that, with respect to the so-called stepped substrate, in which the resist patterns formed on the substrate to be processed have a difference in height and have dense portions and sparse portions, the composition for forming a resist underlayer film has such low coverage that the resultant film has a large difference in the thickness after filling, making it difficult to form a flat film.

The present invention has been made based on the solution to the problems, and an object of the present invention is to provide a resist underlayer film-forming composition, which enables formation of a flat film that exhibits high etching resistance, excellent dry etching rate ratio, and excellent optical coefficient, and which has such excellent coverage for the so-called stepped substrate that the resultant film has a reduced difference in the thickness after filling. Another object of the present invention is to provide a resist underlayer film using the above-mentioned resist underlayer film-forming composition and a method for producing a semiconductor device.

Solution to Problem

The present invention encompasses the followings.

[1] A resist underlayer film-forming composition comprising at least one compound represented by the following formula (A), at least one polymer represented by the following formula (B), and a solvent:

[Formula 1]

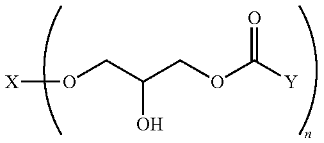

(A)

wherein X represents an n-valent organic group having 2 to 50 carbon atoms, each of n quantity of Y independently represents an aromatic hydrocarbon group having 6 to 60 carbon atoms and having at least one hydroxy group, and n represents an integer of 1 to 4,

[Formula 2]

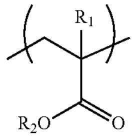

(B)

wherein $R_1$ represents a hydrogen atom or a methyl group, and $R_2$ represents at least one group selected from the following formulae (B-1) to (B-3):

[Formula 3]

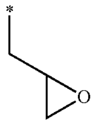

(B-1)

-continued (B-2)

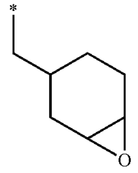

(B-3)

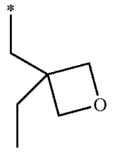

wherein, in formulae (B-1) to (B-3), * represents a bonding site to the adjacent oxygen atom.

[2] The resist underlayer film-forming composition according to [1], wherein X in formula (A) has at least one benzene ring, naphthalene ring, anthracene ring, or pyrene ring or a combination thereof.

[3] The resist underlayer film-forming composition according to [1], wherein each of n quantity of Y in formula (A) independently has a benzene ring, a naphthalene ring, an anthracene ring, or a pyrene ring, each having at least one hydroxy group, or a combination thereof.

[4] The resist underlayer film-forming composition according to [1], wherein n in formula (A) is 2.

[5] The resist underlayer film-forming composition according to [1], wherein the solvent has a boiling point of 160° C. or higher.

[6] A resist underlayer film, which is a baked product of an applied film comprising the resist underlayer film-forming composition according to any one of [1] to [5].

[7] A method for producing a semiconductor device, comprising the steps of:

forming a resist underlayer film on a semiconductor substrate using the resist underlayer film-forming composition according to any one of [1] to [5];

forming a resist film on the formed resist underlayer film;

irradiating the formed resist film with a light or an electron beam and subjecting the resultant resist film to development to form a resist pattern;

etching the resist underlayer film through the formed resist pattern to form a patterned resist underlayer film; and processing the semiconductor substrate through the patterned resist underlayer film.

Advantageous Effects of Invention

The resist underlayer film forming composition of the present invention is advantageous in that a flat film having high etching resistance, excellent dry etching rate ratio, and excellent optical coefficient is formed, as well as in that the resist underlayer film obtained from the composition has such excellent coverage even for a so-called stepped substrate that the film has a reduced difference in the thickness after encapsulation, achieving even finer microfabrication for a substrate.

Particularly, the resist underlayer film forming composition of the present invention is effective in a lithography process, in which at least two layers of a resist underlayer film aimed at reducing the thickness of the resist film are formed and the resist underlayer films are used as an etching mask.

DESCRIPTION OF EMBODIMENTS

Resist Underlayer Film Forming Composition

The resist underlayer film forming composition of the present invention comprises at least one compound represented by the following formula (A), at least one polymer represented by the following formula (B), and a solvent:

[Formula 4]

(A)

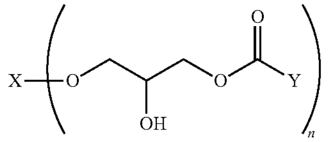

wherein X represents an n-valent organic group having 2 to 50 carbon atoms, each of n quantity of Y independently represents an aromatic hydrocarbon group having 6 to 60 carbon atoms and having at least one hydroxy group, and n represents an integer of 1 to 4,

[Formula 5]

(B)

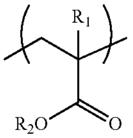

wherein $R_1$ represents a hydrogen atom or a methyl group, and $R_2$ represents at least one group selected from the following formulae (B-1) to (B-3):

[Formula 6]

(B-1)

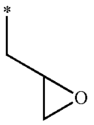

(B-2)

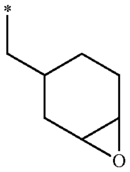

(B-3)

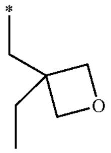

wherein, in formulae (B-1) to (B-3), * represents a bonding site to the adjacent oxygen atom.

Explanation is made below.

[Compound Represented by Formula (A)]

X in formula (A) is an n-valent organic group having 2 to 50 carbon atoms. The n-valent organic group means a group obtained by removing n quantity of hydrogen atom(s) from a carbon-containing compound. n is 1, 2, 3, or 4. The carbon-containing compound includes a hydrocarbon compound, and the hydrocarbon compound includes an aliphatic hydrocarbon, an alicyclic hydrocarbon, and an aromatic hydrocarbon. The carbon-containing compound may contain in the molecule thereof an atom other than carbon and hydrogen, for example, one or more atoms of oxygen, nitrogen, sulfur, a halogen, an alkali metal, an alkaline earth metal, or a transition metal. The number of carbon atoms contained in the organic group is 2 to 50, preferably 4 or more, 6 or more, 8 or more, 10 or more, 42 or less, 34 or less, 26 or less, or 18 or less.

Each of n quantity of Y in formula (A) is independently an aromatic hydrocarbon group having 6 to 60 carbon atoms and having at least one hydroxy group.

The aromatic hydrocarbon group having 6 to 60 carbon atoms means a group obtained by removing one hydrogen atom from:

(a) a monocyclic compound, such as benzene, phenol, or phloroglucinol, (b) a fused ring compound, such as naphthalene or dihydroxynaphthalene, (c) a heterocyclic compound, such as furan, thiophene, pyridine, or carbazole, (d) a compound obtained by bonding aromatic rings out of (a) to (c), such as biphenyl, phenylindole, 9,9-bis(4-hydroxyphenyl)fluorene, or α,α,α',α'-tetrakis(4-hydroxyphenyl)-p-xylene, through a single bond, or (e) a compound obtained by linking aromatic rings out of (a) to (d), such as phenylnaphthylamine, through such a spacer as $-CH_2-$, $-(CH_2)_n-$ (n=1 to 20), —CH<, —CH═CH—, —C≡C—, —N═N—, —NH—, —NR—, —NHCO—, —NRCO—, —S—, —COO—, —O—, —CO—, or —CH═N—.

Examples of aromatic compounds include benzene, thiophene, furan, pyridine, pyrimidine, pyrazine, pyrrole, oxazole, thiazole, imidazole, naphthalene, anthracene, quinoline, carbazole, quinazoline, purine, indolizine, benzothiophene, benzofuran, indole, phenylindole, and acridine.

Further, the above-mentioned aromatic compound has at least one hydroxy group.

The aromatic compound having at least one hydroxy group is preferably a phenolic hydroxy group-containing compound.

Examples of phenolic hydroxy group-containing compounds include phenol, dihydroxybenzene, trihydroxybenzene, hydroxynaphthalene, dihydroxynaphthalene, trihydroxynaphthalene, tris(4-hydroxyphenyl)methane, tris(4-hydroxyphenyl)ethane, 1,1,2,2-tetrakis(4-hydroxyphenyl)ethane, and polynuclear phenols.

Examples of the polynuclear phenols include dihydroxybenzene, trihydroxybenzene, hydroxynaphthalene, dihydroxynaphthalene, trihydroxynaphthalene, tris(4-hydroxyphenyl)methane, tris(4-hydroxyphenyl)ethane, 2,2'-biphenol, and 1,1,2,2-tetrakis(4-hydroxyphenyl)ethane.

The hydrogen atom of the aromatic compound having 6 to 60 carbon atoms may be replaced by an alkyl group having 1 to 20 carbon atoms, a fused ring group, a heterocyclic group, a hydroxy group, an amino group, a nitro group, an ether group, an alkoxy group, a cyano group, or a carboxyl group.

Examples of the alkyl groups having 1 to 20 carbon atoms include linear or branched alkyl groups optionally having a substituent, such as a methyl group, an ethyl group, a n-propyl group, an isopropyl group, a n-butyl group, a sec-butyl group, a tert-butyl group, a n-pentyl group, an isopentyl group, a neopentyl group, a n-hexyl group, an isohexyl group, a n-heptyl group, a n-octyl group, a cyclohexyl group, a 2-ethylhexyl group, a n-nonyl group, an isononyl group, a p-tert-butylcyclohexyl group, a n-decyl group, a n-dodecylnonyl group, an undecyl group, a dodecyl group, a tridecyl group, a tetradecyl group, a pentadecyl group, a hexadecyl group, a heptadecyl group, an octadecyl group, a nonadecyl group, and an eicosyl group. Preferred are alkyl groups having 1 to 12 carbon atoms; more preferred are alkyl groups having 1 to 8 carbon atoms; and further preferred are alkyl groups having 1 to 4 carbon atoms.

Examples of alkyl groups having 1 to 20 carbon atoms and being interrupted by an oxygen atom, a sulfur atom, or an amide linkage include alkyl groups containing a structural unit $-CH_2-O-$, $-CH_2-S-$, $-CH_2-NHCO-$, or $-CH_2-CONH-$. In the alkyl groups may be present one unit or two or more units of —O—, —S—, —NHCO—, or —CONH—. Specific examples of alkyl groups having 1 to 20 carbon atoms and being interrupted by an —O—, —S—, —NHCO—, or —CONH— unit include a methoxy group, an ethoxy group, a propoxy group, a butoxy group, a methylthio group, an ethylthio group, a propylthio group, a butylthio group, a methylcarbonylamino group, an ethylcarbonylamino group, a propylcarbonylamino group, a butylcarbonylamino group, a methylaminocarbonyl group, an ethylaminocarbonyl group, a propylaminocarbonyl group, and a butylaminocarbonyl group; and further include a methyl group, an ethyl group, a propyl group, a butyl group, a pentyl group, a hexyl group, a heptyl group, an octyl group, a nonyl group, a decyl group, a dodecyl group, and an octadecyl group, each of which is substituted with, for example, a methoxy group, an ethoxy group, a propoxy group, a butoxy group, a methylthio group, an ethylthio group, a propylthio group, a butylthio group, a methylcarbonylamino group, an ethylcarbonylamino group, a methylaminocarbonyl group, or an ethylaminocarbonyl group. Preferred are a methoxy group, an ethoxy group, a methylthio group, and an ethylthio group; and more preferred are a methoxy group and an ethoxy group.

The fused ring group is a substituent derived from a fused ring compound, and specific examples include a phenyl group, a naphthyl group, an anthracenyl group, a phenanthrenyl group, a naphthacenyl group, a triphenylenyl group, a pyrenyl group, and a chrysenyl group. Of these, preferred are a phenyl group, a naphthyl group, an anthracenyl group, and a pyrenyl group.

The heterocyclic group is a substituent derived from a heterocyclic compound, and specific examples include a thiophene group, a furan group, a pyridine group, a pyrimidine group, a pyrazine group, a pyrrole group, an oxazole group, a thiazole group, an imidazole group, a quinoline group, a carbazole group, a quinazoline group, a purine group, an indolizine group, a benzothiophene group, a benzofuran group, an indole group, an acridine group, an isoindole group, a benzimidazole group, an isoquinoline group, a quinoxaline group, a cinnoline group, a pteridine group, a chromene group (benzopyran group), an isochromene group (benzopyran group), a xanthene group, a thiazole group, a pyrazole group, an imidazoline group, and an azine group. Of these, preferred are a thiophene group, a furan group, a pyridine group, a pyrimidine group, a pyrazine group, a pyrrole group, an oxazole group, a thiazole group, an imidazole group, a quinoline group, a carbazole group, a quinazoline group, a purine group, an indolizine group, a benzothiophene group, a benzofuran group, an indole group, and an acridine group; and most preferred are a thiophene group, a furan group, a pyridine group, a pyrimidine group, a pyrrole group, an oxazole group, a thiazole group, an imidazole group, and a carbazole group.

The above-mentioned aromatic hydrocarbon group may be linked to another one through a single bond or a spacer.

Examples of spacers include $—CH_2—$, $—(CH_2)_n—$ (n=1 to 20), —CH<, —CH═CH—, —C≡C—, —N═N—, —NH—, —NR—, —NHCO—, —NRCO—, —S—, —COO—, —O—, —CO—, and —CH═N— and a combination thereof. Two or more spacers may be linked together.

The aromatic hydrocarbon group preferably has at least one benzene ring, naphthalene ring, anthracene ring, or pyrene ring or a combination thereof; more preferably has two or more benzene rings, naphthalene rings, anthracene rings, or pyrene rings or a combination thereof.

[Preparation of Compound (A)]

The compound represented by formula (A) may be prepared by an arbitrary method well known to those skilled in the art. For example, the compound of formula (A) wherein n is 2 may be prepared according to the synthesis scheme shown below.

[Formula 7]

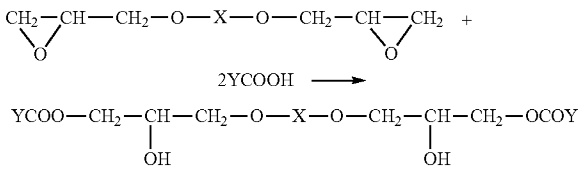

In the above synthesis scheme, one molecule of diglycidyl compound and two molecules of carboxylic acid compound are reacted with each other to cause two epoxy groups of the diglycidyl compound to undergo ring-opening, so that the two carboxylic acid compounds are bonded together, obtaining compound (A).

Examples of catalysts used in the reaction for activating the epoxy group include quaternary phosphonium salts, such as ethyltriphenylphosphonium bromide, and quaternary ammonium salts, such as benzyltriethylammonium chloride. The amount of the catalyst used is generally within the range of 0.001 to 1 equivalent, relative to 1 equivalent of the epoxy group.

The above-mentioned reaction may be conducted without using a solvent, but is generally conducted using a solvent. Any solvent may be used as long as it does not inhibit the reaction. Examples of solvents include ethers, such as 1,2-dimethoxyethane, diethylene glycol dimethyl ether, propylene glycol monomethyl ether, propylene glycol monomethyl ether acetate, tetrahydrofuran, and dioxane.

The reaction temperature is generally within the range of 40 to 200° C. The reaction time is appropriately selected depending on the reaction temperature, but is generally within the range of about 30 minutes to 50 hours.

The thus obtained crude product may be subjected to ion-exchange treatment by adding an anion-exchange resin and/or a cation-exchange resin to the product according to a general method.

The compound obtained as mentioned above generally has a weight average molecular weight Mw of 500 to 1,000, or 600 to 900.

[Polymer Represented by Formula (B)]

The polymer represented by formula (B) may be prepared by subjecting (meth)acrylic acid having at least one group selected from formulae (B-1) to (B-3) above or a derivative thereof to polymerization according to an arbitrary method well known to those skilled in the art.

With respect to the weight average molecular weight of the polymer represented by formula (B), there is no particular limitation, but the weight average molecular weight of the polymer is preferably 1,000 or more, 2,000 or more, 5,000 or more, 50,000 or less, 20,000 or less, or 10,000 or less.

[Solvent]

With respect to the solvent for the resist underlayer film-forming composition of the present invention, there is no particular limitation as long as it is a solvent that can dissolve therein the above-mentioned compound (A) and polymer (B) and other components, and any of such solvents may be used. Particularly, the resist underlayer film-forming composition of the present invention is used in a uniform solution state, and therefore, taking the application properties of the composition into consideration, it is recommended that a solvent generally used in a lithography process should be also used.

Examples of such solvents include methyl cellosolve acetate, ethyl cellosolve acetate, propylene glycol, propylene glycol monomethyl ether, propylene glycol monoethyl ether, methylisobutyl carbinol, propylene glycol monobutyl ether, propylene glycol monomethyl ether acetate, propylene glycol monoethyl ether acetate, propylene glycol monopropyl ether acetate, propylene glycol monobutyl ether acetate, toluene, xylene, methyl ethyl ketone, cyclopentanone, cyclohexanone, ethyl 2-hydroxypropionate, ethyl 2-hydroxy-2-methylpropionate, ethyl ethoxyacetate, ethyl hydroxyacetate, methyl 2-hydroxy-3-methylbutanoate, methyl 3-methoxypropionate, ethyl 3-methoxypropionate, ethyl 3-ethoxypropionate, methyl 3-ethoxypropionate, methyl pyruvate, ethyl pyruvate, ethylene glycol monomethyl ether, ethylene glycol monoethyl ether, ethylene glycol monopropyl ether, ethylene glycol monobutyl ether, ethylene glycol monomethyl ether acetate, ethylene glycol monoethyl ether acetate, ethylene glycol monopropyl ether acetate, ethylene glycol monobutyl ether acetate, diethylene glycol dimethyl ether, diethylene glycol diethyl ether, diethylene glycol dipropyl ether, diethylene glycol dibutyl ether, propylene glycol monomethyl ether, propylene glycol dimethyl ether, propylene glycol diethyl ether, propylene glycol dipropyl ether, propylene glycol dibutyl ether, ethyl lactate, propyl lactate, isopropyl lactate, butyl lactate, isobutyl lactate, methyl formate, ethyl formate, propyl formate, isopropyl formate, butyl formate, isobutyl formate, amyl formate, isoamyl formate, methyl acetate, ethyl acetate, amyl acetate, isoamyl acetate, hexyl acetate, methyl propionate, ethyl propionate, propyl propionate, isopropyl propionate, butyl propionate, isobutyl propionate, methyl butyrate, ethyl butyrate, propyl butyrate, isopropyl butyrate, butyl butyrate, isobutyl butyrate, ethyl hydroxyacetate, ethyl 2-hydroxy-2-methylpropionate, methyl 3-methoxy-2-methylpropionate, methyl 2-hydroxy-3-methylbutyrate, ethyl methoxyacetate, ethyl ethoxyacetate, methyl 3-methoxypropionate, ethyl 3-ethoxypropionate, ethyl 3-methoxypropionate, 3-methoxybutyl acetate, 3-methoxypropyl acetate, 3-methyl-3-methoxybutyl acetate, 3-methyl-3-methoxybutyl propionate, 3-methyl-3-methoxybutyl butyrate, methyl acetoacetate, toluene, xylene, methyl ethyl ketone, methyl propyl ketone, methyl butyl ketone, 2-heptanone, 3-heptanone, 4-heptanone, cyclohexanone, N,N-dimethylformamide, N-methylacetamide, N,N-dimethylacetamide, N-methylpyrrolidone, 4-methyl-2-pentanol, and γ-butyrolactone. These solvents may be used each alone or in combination of two or more.

Further, the below-shown compound described in WO2018/131562A1 may also be used:

[Formula 8]

Formula (i)

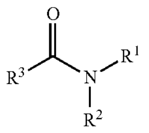

wherein each of $R^1$, $R^2$, and $R^3$ represents a hydrogen atom or an alkyl group having 1 to 20 carbon atoms and optionally being interrupted by an oxygen atom, a sulfur atom, or an amide linkage, wherein $R^1$, $R^2$, and $R^3$ may be the same or different, and may be bonded together to form a cyclic structure.

Examples of alkyl groups having 1 to 20 carbon atoms include linear or branched alkyl groups optionally having a substituent, such as a methyl group, an ethyl group, a n-propyl group, an isopropyl group, a n-butyl group, a sec-butyl group, a tert-butyl group, a n-pentyl group, an isopentyl group, a neopentyl group, a n-hexyl group, an isohexyl group, a n-heptyl group, a n-octyl group, a cyclohexyl group, a 2-ethylhexyl group, a n-nonyl group, an isononyl group, a p-tert-butylcyclohexyl group, a n-decyl group, a n-dodecylnonyl group, an undecyl group, a dodecyl group, a tridecyl group, a tetradecyl group, a pentadecyl group, a hexadecyl group, a heptadecyl group, an octadecyl group, a nonadecyl group, and an eicosyl group. Preferred are alkyl groups having 1 to 12 carbon atoms; more preferred are alkyl groups having 1 to 8 carbon atoms; and further preferred are alkyl groups having 1 to 4 carbon atoms.

Examples of alkyl groups having 1 to 20 carbon atoms and being interrupted by an oxygen atom, a sulfur atom, or an amide linkage include alkyl groups containing a structural unit $—CH_2—O—$, $—CH_2—S—$, $—CH_2—NHCO—$, or $—CH_2—CONH—$. In the alkyl group may be present one unit or two or more units of —O—, —S—, —NHCO—, or —CONH—. Specific examples of alkyl groups having 1 to 20 carbon atoms and being interrupted by an —O—, —S—, —NHCO—, or —CONH— unit include a methoxy group, an ethoxy group, a propoxy group, a butoxy group, a methylthio group, an ethylthio group, a propylthio group, a butylthio group, a methylcarbonylamino group, an ethylcarbonylamino group, a propylcarbonylamino group, a butylcarbonylamino group, a methylaminocarbonyl group, an ethylaminocarbonyl group, a propylaminocarbonyl group, and a butylaminocarbonyl group; and further include a methyl group, an ethyl group, a propyl group, a butyl group, a pentyl group, a hexyl group, a heptyl group, an octyl group, a nonyl group, a decyl group, a dodecyl group, and an octadecyl group, each of which is substituted with, for example, a methoxy group, an ethoxy group, a propoxy group, a butoxy group, a methylthio group, an ethylthio group, a propylthio group, a butylthio group, a methylcarbonylamino group, an ethylcarbonylamino group, a methylaminocarbonyl group, or an ethylaminocarbonyl group. Preferred are a methoxy group, an ethoxy group, a methylthio group, and an ethylthio group, and more preferred are a methoxy group and an ethoxy group.

These solvents have a relatively high boiling point, and therefor are effective in imparting high filling properties or high planarization properties to the resist underlayer film-forming composition.

Specific examples of preferred compounds represented by formula (i) are shown below.

[Formula 9]

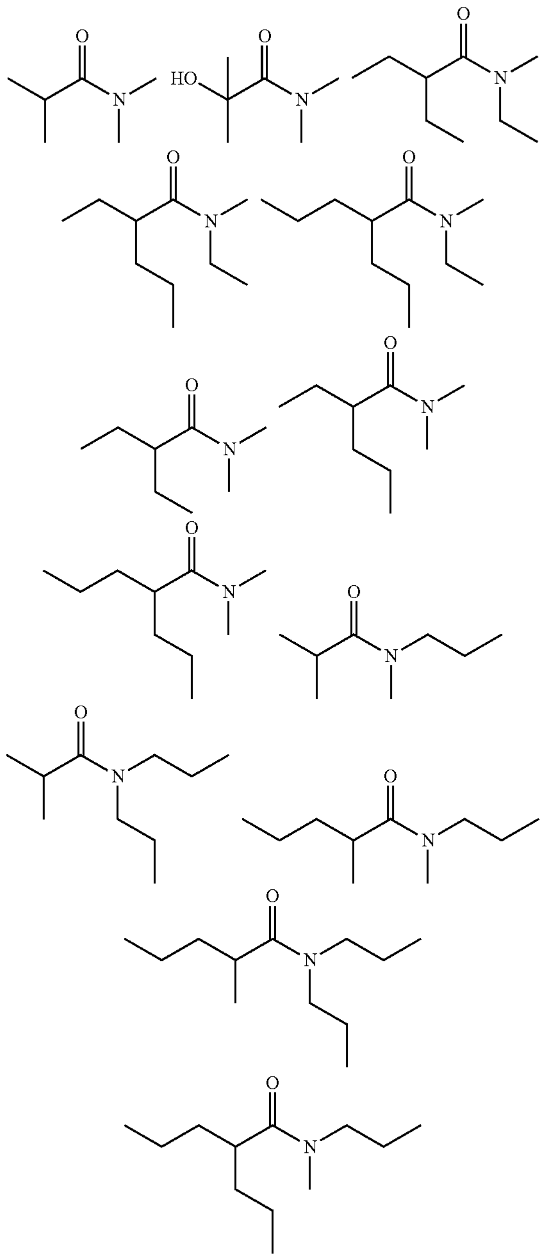

-continued

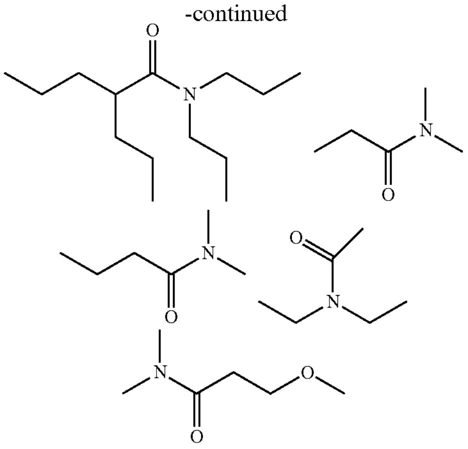

Of the above compounds, preferred are 3-methoxy-N,N-dimethylpropionamide, N,N-dimethylisobutylamide, and compounds represented by the following formulae:

[Formula 10]

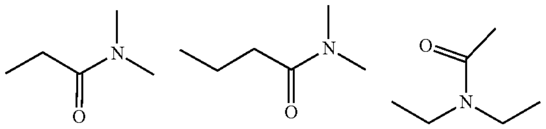

Especially preferred compounds represented by formula (i) are 3-methoxy-N,N-dimethylpropionamide and N,N-dimethylisobutylamide.

These solvents may be used each alone or in combination of two or more. Of these solvents, a solvent having a boiling point of 160° C. or higher is preferred. For example, preferred are propylene glycol monomethyl ether, propylene glycol monomethyl ether acetate, ethyl lactate, butyl lactate, cyclohexanone, 3-methoxy-N,N-dimethylpropionamide, N,N-dimethylisobutylamide, 2,5-dimethylhexane-1,6-diyl-diacetate (DAH; cas, 89182-68-3), and 1,6-diacetoxyhexane (cas, 6222-17-9). Especially preferred are propylene glycol monomethyl ether, propylene glycol monomethyl ether acetate, and N,N-dimethylisobutylamide.

[Crosslinking Agent, Acid and/or Acid Generator]

The polymer represented by formula (B) above has an advantage in that crosslinking of the polymer proceeds only by heat, and further there is no leaving component, and therefore no shrinkage is caused in the formed film, achieving formation of a flat film. However, when a crosslinking agent other than the polymer represented by formula (B) above is incorporated, there is a potentia risk that, for example, a shrinkage in the film is caused by elimination of a functional group during the crosslinking or by heating needed for the crosslinking, adversely affecting the flatness of the obtained film. Therefore, the resist underlayer film-forming composition of the present invention does not contain a crosslinking agent other than the polymer represented by formula (B) above. The term "crosslinking agent" used here generally means a low-molecular weight compound or polymer having at least two crosslink-forming substituents.

Examples of the crosslinking agents that are not contained in the resist underlayer film-forming composition of the present invention include melamines, substituted ureas, and polymers thereof. More specifically, such crosslinking agents are crosslinking agents having at least two crosslink-forming substituents; and include compounds, such as methoxymethylated glycoluril, butoxymethylated glycoluril, methoxymethylated melamine, butoxymethylated melamine, methoxymethylated benzoguanamine, butoxymethylated benzoguanamine, methoxymethylated urea, butoxymethylated urea, and methoxymethylated thiourea. Further, condensation products of the above compound are not contained in the composition, either.

Further, examples of the crosslinking agents that are not contained in the resist underlayer film-forming composition of the present invention include a crosslinking agent having a high heat resistance and containing in the molecule thereof a crosslink-forming substituent having an aromatic ring (for example, a benzene ring or a naphthalene ring).

Examples of the crosslinking agents that are not contained in the resist underlayer film-forming composition of the present invention include compounds having a partial structure of the following formula (4), and polymers or oligomers having repeating units of the following formula (5).

[Formula 11]

Formula (4)

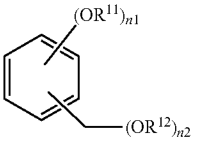

Formula (5)

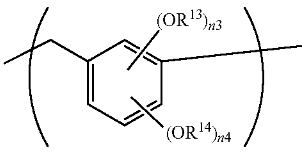

In the above formulae, $R^{11}$, $R^{12}$, $R^{13}$, and $R^{14}$ are a hydrogen atom or an alkyl group having 1 to 10 carbon atoms.

Compounds, polymers, and oligomers of formulae (4) and (5) are exemplified below.

[Formula 12]

Formula(4-1)

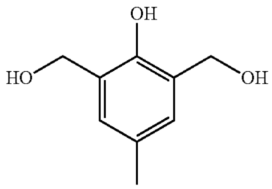

Formula(4-2)

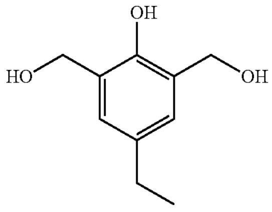

-continued
Formula(4-3)
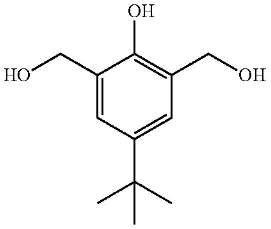
Formula(4-4)
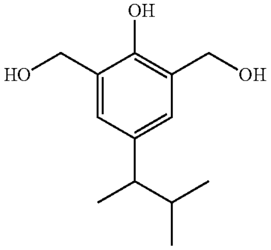
Formula(4-5)
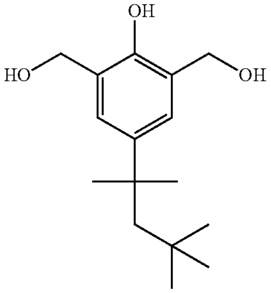
Formula(4-6)
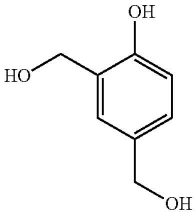
Formula(4-7)
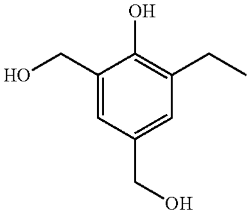
Formula(4-8)
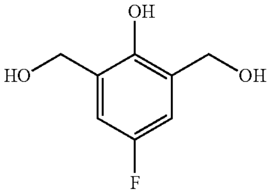
-continued
Formula(4-9)
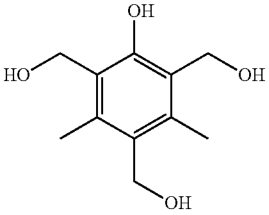
Formula(4-10)
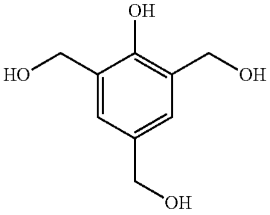
Formula(4-11)
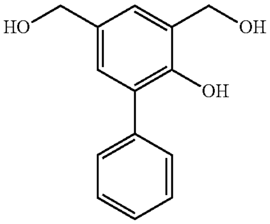
Formula(4-12)
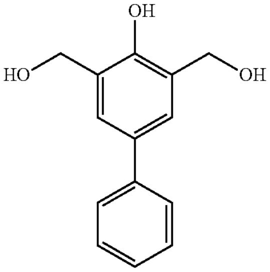
Formula(4-13)
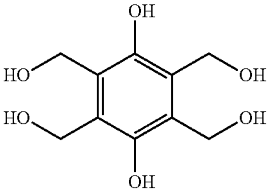
Formula(4-14)
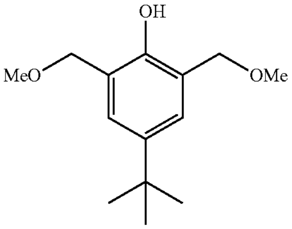
Formula(4-15)
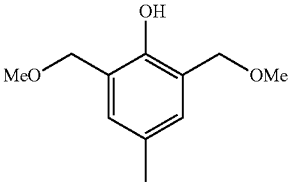

-continued

[Formula 13]

Formula(4-16)

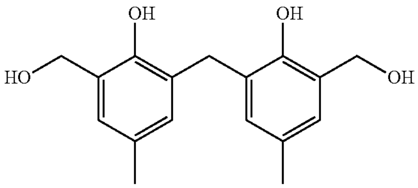

Formula(4-17)

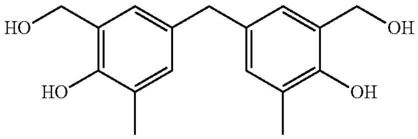

Formula(4-18)

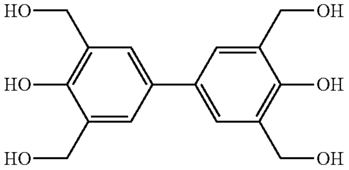

Formula(4-19)

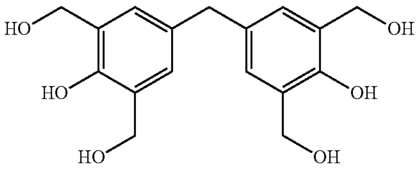

Formula(4-20)

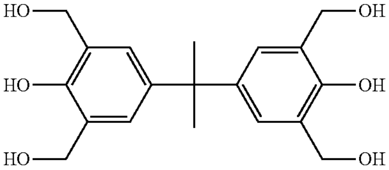

Formula(4-21)

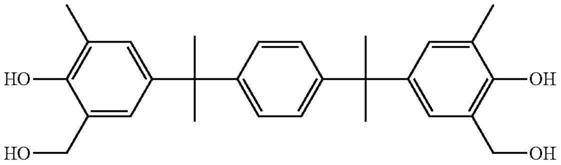

Formula(4-22)

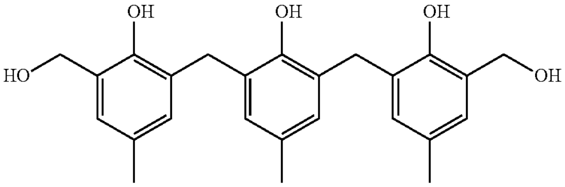

Formula(4-23)

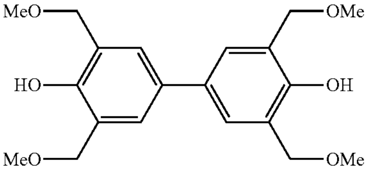

-continued

Formula(4-24)

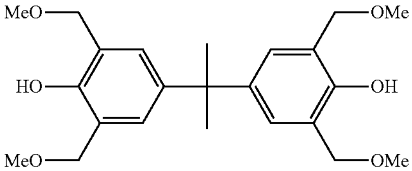

Formula(4-25)

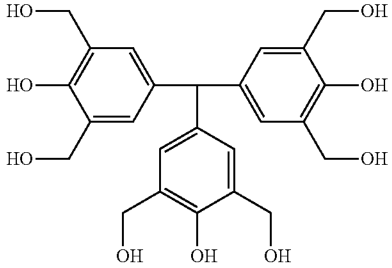

Formula(4-26)

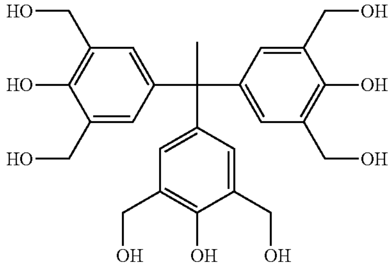

Formula(4-27)

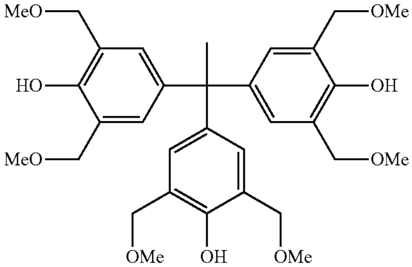

Accordingly, the resist underlayer film-forming composition of the present invention neither contain an "acid" nor an "acid generator", which are usually used in combination with the above-mentioned "crosslinking agent".

Examples of the acids that are not contained in the resist underlayer film-forming composition of the present invention include p-toluenesulfonic acid, trifluoromethanesulfonic acid, pyridinium p-toluenesulfonate, salicylic acid, 5-sulfosalicylic acid, 4-phenolsulfonic acid, camphorsulfonic acid, 4-chlorobenzenesulfonic acid, benzenedisulfonic acid, 1-naphthalenesulfonic acid, citric acid, benzoic acid, hydroxybenzoic acid, and naphthalenecarboxylic acid.

Examples of the acid generators that are not contained in the resist underlayer film-forming composition of the present invention include a thermal acid generator and a photo-acid generator.

Examples of the thermal acid generators that are not contained in the resist underlayer film-forming composition of the present invention include 2,4,4,6-tetrabromocyclohexadienone, benzoin tosylate, 2-nitrobenzyl tosylate, and other organic sulfonic acid alkyl esters.

Examples of the photo-acid generators that are not contained in the resist underlayer film-forming composition of the present invention include onium salt compounds, sulfonimide compounds, and disulfonyldiazomethane compounds.

Examples of the onium salt compounds that are not contained in the resist underlayer film-forming composition of the present invention include iodonium salt compounds, such as diphenyliodonium hexafluorophosphate, diphenyliodonium trifluoromethanesulfonate, diphenyliodonium nonafluoronormalbutanesulfonate, diphenyliodonium perfluoronormaloctanesulfonate, diphenyliodonium camphorsulfonate, bis(4-tert-butylphenyl)iodonium camphorsulfonate, and bis(4-tert-butylphenyl)iodonium trifluoromethanesulfonate; and sulfonium salt compounds, such as triphenylsulfonium hexafluoroantimonate, triphenylsulfonium nonafluoronormalbutanesulfonate, triphenylsulfonium camphorsulfonate, and triphenylsulfonium trifluoromethanesulfonate.

Examples of the sulfonimide compounds that are not contained in the resist underlayer film-forming composition of the present invention include N-(trifluoromethanesulfonyloxy)succinimide, N-(nonafluoronormalbutanesulfonyloxy)succinimide, N-(camphorsulfonyloxy)succinimide, and N-(trifluoromethanesulfonyloxy)naphthalimide.

Examples of the disulfonyldiazomethane compounds that are not contained in the resist underlayer film-forming composition of the present invention include bis(trifluoromethylsulfonyl)diazomethane, bis(cyclohexylsulfonyl)diazomethane, bis(phenylsulfonyl)diazomethane, bis(p-toluenesulfonyl)diazomethane, bis(2,4-dimethylbenzenesulfonyl) diazomethane, and methylsulfonyl-p-toluenesulfonyldiazomethane.

[Other Components]

In the resist underlayer film-forming composition of the present invention, for further improving the application properties to prevent the occurrence of pinhole or striation and uneven surface, a surfactant may be incorporated into the composition. Examples of surfactants include nonionic surfactants, e.g., polyoxyethylene alkyl ethers, such as polyoxyethylene lauryl ether, polyoxyethylene stearyl ether, polyoxyethylene cetyl ether, and polyoxyethylene oleyl ether; polyoxyethylene alkyl aryl ethers, such as polyoxyethylene octylphenol ether and polyoxyethylene nonylphenol ether; polyoxyethylene-polyoxypropylene block copolymers; sorbitan fatty acid esters, such as sorbitan monolaurate, sorbitan monopalmitate, sorbitan monostearate, sorbitan monooleate, sorbitan trioleate, and sorbitan tristearate; and polyoxyethylene sorbitan fatty acid esters, such as polyoxyethylene sorbitan monolaurate, polyoxyethylene sorbitan monopalmitate, polyoxyethylene sorbitan monostearate, polyoxyethylene sorbitan trioleate, and polyoxyethylene sorbitan tristearate, fluorine surfactants, such as EFTOP EF301, EF303, EF352 (trade name, manufactured by Tohchem Products Co., Ltd.), MEGAFACE F171, F173, R-40, R-40N, R-40LM (trade name, manufactured by DIC Corporation), Fluorad FC430, FC431 (trade name, manufactured by Sumitomo 3M), AsahiGuard AG710, Surflon S-382, SC101, SC102, SC103, SC104, SC105, SC106 (trade name, manufactured by AGC Inc.), and organosiloxane polymer KP341 (manufactured by Shin-Etsu Chemical Co., Ltd.). The amount of the surfactant incorporated is generally 2.0% by mass or less, preferably 1.0% by mass or less, based on the mass of the solids of the resist underlayer film material. These surfactants may be used each alone or in combination of two or more. When a surfactant is used, the amount of the surfactant is within the range of 0.0001 to 5 parts by mass, or 0.001 to 1 part by mass, or 0.01 to 0.5 part by mass, relative to 100 parts by mass of the solids of the resist underlayer film-forming composition.

In the resist underlayer film-forming composition of the present invention, for example, a light absorber, a rheology modifier, or a bonding auxiliary may be added. The rheology modifier is effective in improving the fluidity of the resist underlayer film-forming composition. The bonding auxiliary is effective in improving the adhesion between a semiconductor substrate or a resist and the resist underlayer film.

With respect to the light absorber, for example, a commercially available light absorber described in "Kougyo-you Shikiso no Gijutsu to Shijou (Techniques and Markets of Industrial Dyes)" (CMC Publishing Co., Ltd.) or "Senryo Binran (Dye Handbook)" (edited by The Society of Synthetic Organic Chemistry, Japan), for example, C. I. Disperse Yellow 1, 3, 4, 5, 7, 8, 13, 23, 31, 49, 50, 51, 54, 60, 64, 66, 68, 79, 82, 88, 90, 93, 102, 114, and 124; C. I. Disperse Orange 1, 5, 13, 25, 29, 30, 31, 44, 57, 72, and 73; C. I. Disperse Red 1, 5, 7, 13, 17, 19, 43, 50, 54, 58, 65, 72, 73, 88, 117, 137, 143, 199, and 210; C. I. Disperse Violet 43; C. I. Disperse Blue 96; C. I. Fluorescent Brightening Agent 112, 135, and 163; C. I. Solvent Orange 2 and 45; C. I. Solvent Red 1, 3, 8, 23, 24, 25, 27, and 49; C. I. Pigment Green 10; and C. I. Pigment Brown 2 may be preferably used. The light absorber is generally incorporated in an amount of 10% by mass or less, preferably 5% by mass or less, based on the mass of the solids of the resist underlayer film-forming composition.

A rheology modifier is added mainly for the purpose of improving the fluidity of the resist underlayer film-forming composition, particularly for improving the uniformity of the thickness of the resist underlayer film or the filling of the inside of hole with the resist underlayer film-forming composition in the baking step. Specific examples of rheology modifiers include phthalic acid derivatives, such as dimethyl phthalate, diethyl phthalate, diisobutyl phthalate, dihexyl phthalate, and butylisodecyl phthalate; adipic acid derivatives, such as dinormalbutyl adipate, diisobutyl adipate, diisooctyl adipate, and octyldecyl adipate; maleic acid derivatives, such as dinormalbutyl maleate, diethyl maleate, and dinonyl maleate; oleic acid derivatives, such as methyl oleate, butyl oleate, and tetrahydrofurfuryl oleate; and stearic acid derivatives, such as normalbutyl stearate and glyceryl stearate. The rheology modifier is generally incorporated in an amount of less than 30% by mass, based on the mass of the solids of the resist underlayer film-forming composition.

A bonding auxiliary is added mainly for the purpose of improving the adhesion between a substrate or a resist and the resist underlayer film-forming composition to prevent the resist from peeling off particularly in the development. Specific examples of bonding auxiliaries include chlorosilanes, such as trimethylchlorosilane, dimethylmethylolchlorosilane, methyldiphenylchlorosilane, and chloromethyldimethylchlorosilane; alkoxysilanes, such as trimethylmethoxysilane, dimethyldiethoxysilane, methyldimethoxysilane, dimethylmethylolethoxysilane, diphenyldimethoxysilane, and phenyltriethoxysilane; silazanes, such as hexamethyldisilazane, N,N'-bis(trimethylsilyl)urea, dimethyltrimethylsilylamine, and trimethylsilylimidazole; silanes, such as methyloltrichlorosilane, γ-chloropropyltrimethoxysilane, γ-aminopropyltriethoxysilane, and γ-glycidoxypropyltrimethoxysilane; heterocyclic compounds, such as benzotriazole, benzimidazole, indazole, imidazole, 2-mercaptobenzimidazole, 2-mercaptobenzothiazole, 2-mercaptobenzoxazole, urazole, thiouracil, mercaptoimidazole, and mercaptopyrimidine; and urea or thiourea compounds, such as 1,1-dimethylurea and 1,3-dimethylurea. The bonding auxiliary is generally incorporated in an amount of less than 5% by mass, preferably less than 2% by mass, based on the mass of the solids of the resist underlayer film-forming composition.

The resist underlayer film-forming composition of the present invention generally has a solid content of 0.1 to 70% by mass, preferably 0.1 to 60% by mass. The solid content is the proportion of the content of the total components in the resist underlayer film-forming composition except for the solvent. The proportion of the total of the above-mentioned compound (A) and polymer (B) (when two or more compounds (A) or polymers (B) are contained, the total of them) in the solids is, with increasing preference, within the range of 1 to 100% by mass, 1 to 99.9% by mass, 50 to 99.9% by mass, 50 to 95% by mass, and 50 to 90% by mass.

A measure for evaluating the uniformity of the solution of the resist underlayer film-forming composition is to observe the passing property of the composition through a prescribed microfilter. The resist underlayer film-forming composition of the present invention is capable of passing through a microfilter having a pore diameter of 0.1 μm, and thus it is in a uniform solution state.

Examples of materials for the microfilter include fluororesins, such as PTFE (polytetrafluoroethylene) and PFA (tetrafluoroethylene-perfluoroalkyl vinyl ether copolymer), PE (polyethylene), UPE (ultra-high molecular weight polyethylene), PP (polypropylene), PSF (polysulfone), PES (polyether sulfone), and nylon; and a microfilter made of PTFE (polytetrafluoroethylene) is preferred.

[Resist Underlayer Film and Method for Producing a Semiconductor Device]

Hereinbelow, the resist underlayer film using the resist underlayer film-forming composition of the present invention and the method for producing a semiconductor device are described.

The resist underlayer film-forming composition of the present invention is applied onto a substrate used in the production of a semiconductor device (for example, a silicon wafer substrate, a silicon/silicon dioxide coated substrate, a silicon nitride substrate, a glass substrate, an ITO substrate, a polyimide substrate, or a low permittivity material (low-k material) coated substrate) by an appropriate application method, such as a spinner or a coater, and then baked to form a resist underlayer film. Conditions for baking are appropriately selected from those at a baking temperature of 80 to 250° C. for a baking time of 0.3 to 60 minutes. Preferred conditions for baking are those at a baking temperature of 150 to 250° C. for a baking time of 0.5 to 2 minutes. The thickness of the formed resist underlayer film is, for example, 10 to 1,000 nm, or 20 to 500 nm, or 30 to 400 nm, or 50 to 300 nm.

An inorganic resist underlayer film (hard mask) may be formed on the organic resist underlayer film of the present invention. For example, an inorganic resist underlayer film may be formed by spin coating the silicon-containing resist underlayer film (inorganic resist underlayer film) forming composition described in WO2009/104552A1, or a Si inorganic material film may be formed by, for example, a CVD method.

Further, when the resist underlayer film-forming composition of the present invention is applied onto a semiconductor substrate which has a portion having a step and a portion having no step (so-called stepped substrate) and baked, a resist underlayer film having a step in the range of from 3 to 50 nm for the portions of the substrate having a step and having no step can be formed.

Then, a resist film, for example, a layer of photoresist is formed on the resist underlayer film. The layer of photoresist may be formed by a known method, namely, by applying a photoresist composition solution onto the resist underlayer film and baking the applied composition. The thickness of the photoresist is, for example, within the range of 50 to 10,000 nm, or 100 to 2,000 nm, or 200 to 1,000 nm.

With respect to the photoresist formed on the resist underlayer film, there is no particular limitation as long as it is sensitive to a light used in the exposure. Any of a negative photoresist and a positive photoresist may be used. There are, for example, a positive photoresist comprising a novolak resin and 1,2-naphthoquinonediazidosulfonate, a chemical amplification photoresist comprising a binder having a group which is decomposed due to an acid to increase the alkali solubility, and a photo-acid generator, a chemical amplification photoresist comprising a low-molecular weight compound which is decomposed due to an acid to increase the alkali solubility of the photoresist, an alkali-soluble binder, and a photo-acid generator, and a chemical amplification photoresist comprising a binder having a group which is decomposed due to an acid to increase the alkali solubility, a low-molecular weight compound which is decomposed due to an acid to increase the alkali solubility of the photoresist, and a photo-acid generator. The example includes trade name: APEX-E, manufactured by Shipley Company, Inc., trade name: PAR710, manufactured by Sumitomo Chemical Co., Ltd., and trade name: SEPR430, manufactured by Shin-Etsu Chemical Co., Ltd. Further, it includes fluorine atom-containing polymer photoresists described in, for example, Proc. SPIE, Vol. 3999, 330-334 (2000), Proc. SPIE, Vol. 3999, 357-364 (2000), and Proc. SPIE, Vol. 3999, 365-374 (2000).

Next, a resist pattern is formed by irradiation with a light or an electron beam and development. Exposure through a predetermined mask is first conducted. In the exposure, for example, a near ultraviolet light, a far ultraviolet light, or an extreme ultraviolet light (for example, an EUV (wavelength: 13.5 nm)) is used. Specifically, for example, a KrF excimer laser (wavelength: 248 nm), an ArF excimer laser (wavelength: 193 nm), or an $F_2$ excimer laser (wavelength: 157 nm) may be used. Of these, an ArF excimer laser (wavelength: 193 nm) and an EUV (wavelength: 13.5 nm) are preferred. After the exposure, if necessary, post exposure bake may be performed. The post exposure bake is performed under conditions appropriately selected from those at a heating temperature of 70 to 150° C. for a heating time of 0.3 to 10 minutes.

Further, in the present invention, as a resist, instead of the photoresist, a resist for electron beam lithography may be used. Any of a negative electron beam resist and a positive electron beam resist may be used. There are, for example, a chemical amplification resist comprising an acid generator and a binder having a group which is decomposed due to an acid to change the alkali solubility, a chemical amplification resist comprising an alkali-soluble binder, an acid generator, and a low-molecular weight compound which is decomposed due to an acid to change the alkali solubility of the resist, a chemical amplification resist comprising an acid generator, a binder having a group which is decomposed due to an acid to change the alkali solubility, and a low-molecular weight compound which is decomposed due to an acid to change the alkali solubility of the resist, a non-chemical amplification resist comprising a binder having a group which is decomposed due to an electron beam to change the alkali solubility, and a non-chemical amplification resist comprising a binder having a site which suffers breakage due to an electron beam to change the alkali solubility. Also when using the above electron beam resist, a resist pattern may be similarly formed as in the case where a photoresist is used and an electron beam is used as a source of irradiation.

Then, development using a developer is conducted. In the development, for example, when a positive photoresist is used, the exposed portion of the photoresist is removed, so that a photoresist pattern is formed.

Examples of developers include alkaline aqueous solutions, e.g., aqueous solutions of an alkali metal hydroxide, such as potassium hydroxide or sodium hydroxide, aqueous solutions of a quaternary ammonium hydroxide, such as tetramethylammonium hydroxide, tetraethylammonium hydroxide, or choline, and aqueous solutions of an amine, such as ethanolamine, propylamine, or ethylenediamine. Further, for example, a surfactant may be added to the above developer. Conditions for the development are appropriately selected from those at a temperature of 5 to 50° C. for a time of 10 to 600 seconds.

Subsequently, using the thus formed photoresist (upper layer) pattern as a protective film, the inorganic underlayer film (intermediate layer) is removed, and then, using a film comprising the patterned photoresist and inorganic underlayer film (intermediate layer) as a protective film, the organic underlayer film (lower layer) is removed. Finally, using the patterned inorganic underlayer film (intermediate layer) and organic underlayer film (lower layer) as a protective film, processing of the semiconductor substrate is performed.

First, a portion of the inorganic underlayer film (intermediate layer), from which the photoresist is removed, is removed by dry etching so that the semiconductor substrate is exposed. In the dry etching for the inorganic underlayer film, for example, a gas of tetrafluoromethane ($CF_4$), perfluorocyclobutane ($C_4F_8$), perfluoropropane ($C_3F_8$), trifluoromethane, carbon monoxide, argon, oxygen, nitrogen, sulfur hexafluoride, difluoromethane, nitrogen trifluoride, chlorine trifluoride, chlorine, trichloroborane, or dichloroborane may be used. In the dry etching for the inorganic underlayer film, a halogen-based gas is preferably used, and a fluorine-based gas is more preferably used. Examples of fluorine-based gases include tetrafluoromethane ($CF_4$), perfluorocyclobutane ($C_4F_8$), perfluoropropane ($C_3F_8$), trifluoromethane, and difluoromethane ($CH_2F_2$).

Then, using a film comprising the patterned photoresist and inorganic underlayer film as a protective film, the organic underlayer film is removed. The organic underlayer film (lower layer) is preferably removed by dry etching using an oxygen-based gas. The reason for this is that the inorganic underlayer film containing silicon atoms in a large amount is unlikely to be removed by dry etching using an oxygen-based gas.

Finally, processing of the semiconductor substrate is conducted. The processing of the semiconductor substrate is preferably conducted by dry etching using a fluorine-based gas.

Examples of fluorine-based gases include tetrafluoromethane ($CF_4$), perfluorocyclobutane ($C_4F_8$), perfluoropropane ($C_3F_8$), trifluoromethane, and difluoromethane ($CH_2F_2$).

Further, before forming the photoresist, an organic antireflection film may be formed on the resist underlayer film as an upper layer. With respect to the antireflection film composition used in forming the antireflection film, there is no particular limitation, and an antireflection film composition may be arbitrarily selected from those which have been usually used in a lithography process, and an antireflection film may be formed by a method commonly used, for example, by applying the composition using a spinner or a coater and baking it.

In the present invention, an organic underlayer film is formed on a substrate, and then an inorganic underlayer film is formed on the organic film, and the resultant film may be covered with a photoresist. By virtue of this, even when a substrate is covered with a photoresist having a smaller thickness for preventing an occurrence of pattern collapse due to a reduced pattern width of the photoresist, appropriate selection of an etching gas enables processing of the substrate. For example, processing of the resist underlayer film may be made by using as an etching gas a fluorine-based gas having an etching rate satisfactorily faster than that for the photoresist, and processing of the substrate may be made by using as an etching gas a fluorine-based gas having an etching rate satisfactorily faster than that for the inorganic underlayer film, and further processing of the substrate may be made by using as an etching gas an oxygen-based gas having an etching rate satisfactorily faster than that for the organic underlayer film.

The resist underlayer film formed from the resist underlayer film-forming composition may have an absorption with respect to the light used in a lithography process depending on the wavelength of the light. In such a case, the resist underlayer film may function as an antireflection film having an effect of preventing a light reflected from the substrate. Further, the resist underlayer film formed from the resist underlayer film-forming composition of the present invention may function as a hard mask. The resist underlayer film of the present invention may also be used as, for example, a layer for preventing an interaction between a substrate and a photoresist, a layer having a function that it prevents an adverse effect on a substrate of the material used in a photoresist or a substance formed during the exposure for the photoresist, a layer having a function that it prevents a substance generated from a substrate upon heating or baking from diffusing into a photoresist as an upper layer, and a barrier layer for reducing the photoresist layer poisoning effect of a semiconductor substrate dielectric layer.

Further, the resist underlayer film formed from the resist underlayer film-forming composition is applied to a substrate having formed via holes used in a dual-damascene process, and may be used as an filling material capable of completely filling holes. Furthermore, the resist underlayer film may also be used as a planarization material for making the uneven surface of a semiconductor substrate flat.

EXAMPLES

Hereinbelow, specific examples of the resist underlayer film-forming composition of the present invention will be described with reference to the following Examples, which should not be construed as limiting the scope of the present invention.

The apparatus and others used in the measurement of the weight average molecular weight of the reaction products obtained in the following Synthesis Examples are shown below.

Apparatus: HLC-8320GPC, manufactured by Tosoh Corp.

GPC Column: TSKgel Super-MultiporeHZ-N (two columns)

Column temperature: 40° C.

Flow rate: 0.35 ml/minute

Eluent: THF

Standard sample: Polystyrene (Showa Denko K.K.)

Chemical structures of the reagents used in the following Synthesis Examples are shown below.

[Formula 14]

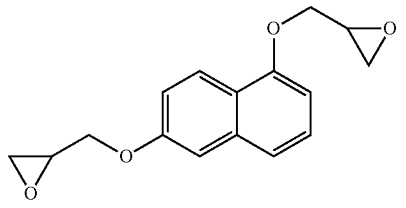

HP-4032D

[Formula 15]

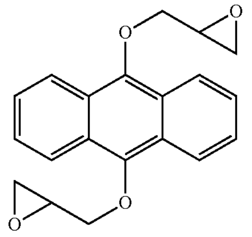

YX8800

-continued

[Formula 16]

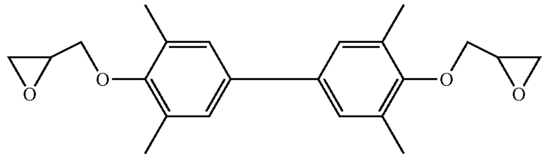

YX4000

Synthesis Example 1

To 149.42 g of propylene glycol monomethyl ether (hereinafter, abbreviated to "PGME" in the present specification) were added 25.00 g of trade name: HP-4032D (manufactured by DIC Corporation), 37.34 g of 3,7-dihydroxy-2-naphthoic acid (manufactured by Midori Kagaku Co., Ltd.), and 1.70 g of ethyltriphenylphosphonium bromide as a catalyst, and then the resultant mixture was allowed to react at 140° C. for 24 hours, obtaining a solution containing a reaction product. To the obtained solution were added 64.00 g of an anion-exchange resin (product name: Dowex [registered trademark] MONOSPHERE [registered trademark] 550A, Muromachi Technos Co., Ltd.) and 64.00 g of a cation-exchange resin (product name: Amberlyst [registered trademark] 15JWET, Organo Corporation), and the resultant mixture was stirred at 25 to 30° C. for 4 hours, and then subjected to filtration.

A GPC analysis made with respect to the obtained reaction product showed that the reaction product had a weight average molecular weight of 680, as determined using a conversion calibration curve obtained from the standard polystyrene. The obtained reaction product is presumed to be a compound having structural unit represented by the following formula (1).

[Formula 17]

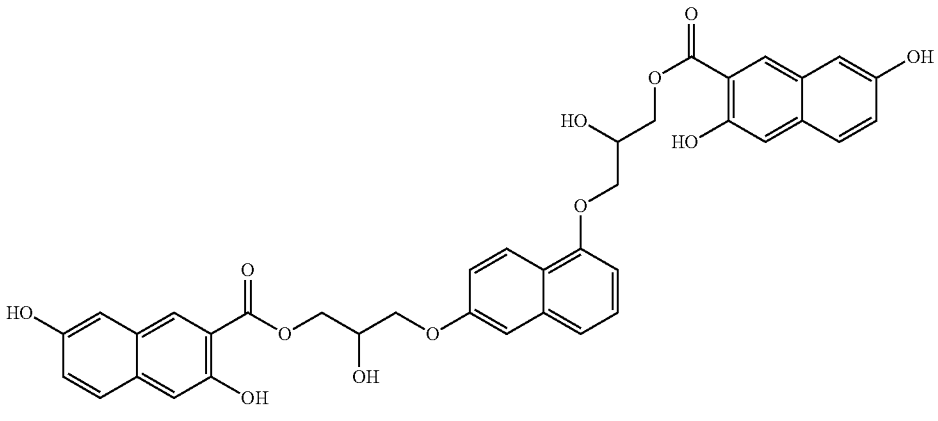

(1)

Synthesis Example 2

To 154.07 g of PGME were added 30.00 g of trade name: YX8800 (manufactured by Mitsubishi Chemical Corporation), 34.46 g of 3,7-dihydroxy-2-naphthoic acid (manufactured by Midori Kagaku Co., Ltd.), and 1.57 g of ethyltriphenylphosphonium bromide as a catalyst, and then the resultant mixture was allowed to react at 140° C. for 24 hours, obtaining a solution containing a reaction product. To the obtained solution were added 66.00 g of an anion-exchange resin (product name: Dowex [registered trademark] MONOSPHERE [registered trademark] 550A, Muromachi Technos Co., Ltd.) and 66.00 g of a cation-exchange resin (product name: Amberlyst [registered trademark] 15JWET, Organo Corporation), and the resultant mixture was stirred at 25 to 30° C. for 4 hours, and then subjected to filtration.

A GPC analysis made with respect to the obtained reaction product showed that the reaction product had a weight average molecular weight of 690, as determined using a conversion calibration curve obtained from the standard polystyrene. The obtained reaction product is presumed to be a compound having structural unit represented by the following formula (2).

[Formula 18]

(2)

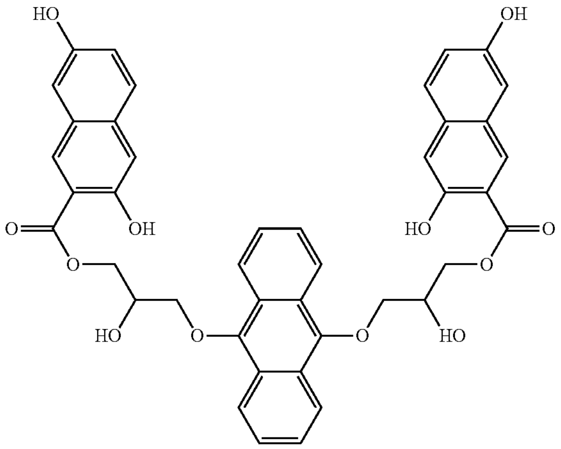

Synthesis Example 3

To 35.18 g of PGME were added 7.00 g of trade name: YX4000 (manufactured by Mitsubishi Chemical Corporation), 7.73 g of 3,7-dihydroxy-2-naphthoic acid (manufactured by Midori Kagaku Co., Ltd.), and 0.35 g of ethyltriphenylphosphonium bromide as a catalyst, and then the resultant mixture was allowed to react at 140° C. for 24 hours, obtaining a solution containing a reaction product. To the obtained solution were added 15.00 g of an anion-exchange resin (product name: Dowex [registered trademark] MONOSPHERE [registered trademark] 550A, Muromachi Technos Co., Ltd.) and 15.00 g of a cation-exchange resin (product name: Amberlyst [registered trademark] 15JWET, Organo Corporation), and the resultant mixture was stirred at 25 to 30° C. for 4 hours, and then subjected to filtration.

A GPC analysis made with respect to the obtained reaction product showed that the reaction product had a weight average molecular weight of 820, as determined using a conversion calibration curve obtained from the standard polystyrene. The obtained reaction product is presumed to be a compound having structural unit represented by the following formula (3).

[Formula 19]

(3)

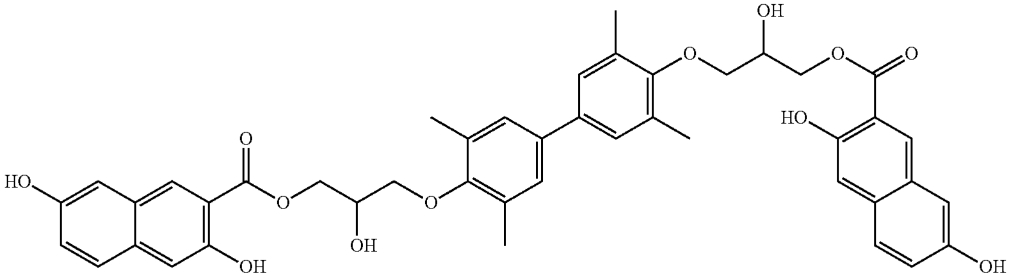

Synthesis Example 4

To 34.22 g of PGME were added 6.00 g of trade name: HP-4032D (manufactured by DIC Corporation), 8.27 g of 6-hydroxy-2-naphthoic acid (manufactured by Tokyo Chemical Industry Co., Ltd.), and 0.41 g of ethyltriphenylphosphonium bromide as a catalyst, and then the resultant mixture was allowed to react at 140° C. for 24 hours, obtaining a solution containing a reaction product. To the obtained solution were added 14.70 g of an anion-exchange resin (product name: Dowex [registered trademark] MONOSPHERE [registered trademark] 550A, Muromachi Technos Co., Ltd.) and 14.70 g of a cation-exchange resin (product name: Amberlyst [registered trademark] 15JWET, Organo Corporation), and the resultant mixture was stirred at 25 to 30° C. for 4 hours, and then subjected to filtration.

A GPC analysis made with respect to the obtained reaction product showed that the reaction product had a weight average molecular weight of 720, as determined using a conversion calibration curve obtained from the standard polystyrene. The obtained reaction product is presumed to be a compound having structural unit represented by the following formula (4).

[Formula 20]

(4)

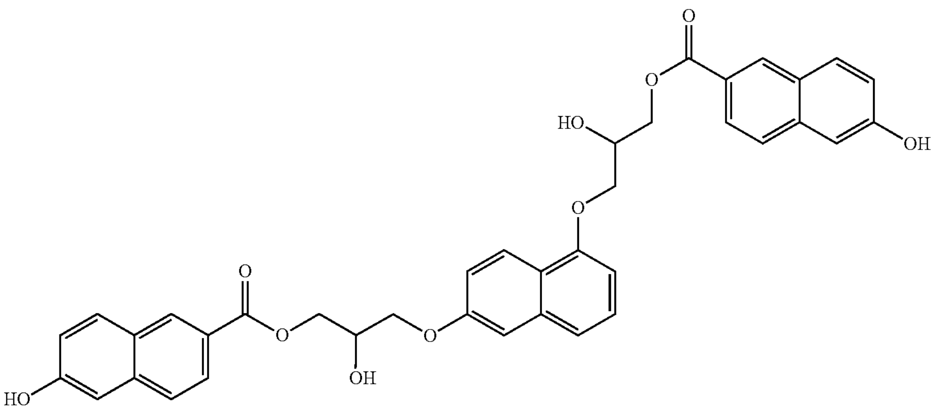

Synthesis Example 5

To 34.22 g of PGME were added 6.00 g of trade name: HP-4032D (manufactured by DIC Corporation), 8.27 g of 6-hydroxy-1-naphthoic acid (manufactured by Tokyo Chemical Industry Co., Ltd.), and 0.41 g of ethyltriphenylphosphonium bromide as a catalyst, and then the resultant mixture was allowed to react at 140° C. for 24 hours, obtaining a solution containing a reaction product. To the obtained solution were added 14.70 g of an anion-exchange resin (product name: Dowex [registered trademark] MONOSPHERE [registered trademark] 550A, Muromachi Technos Co., Ltd.) and 14.70 g of a cation-exchange resin (product name: Amberlyst [registered trademark] 15JWET, Organo Corporation), and the resultant mixture was stirred at 25 to 30° C. for 4 hours, and then subjected to filtration.

A GPC analysis made with respect to the obtained reaction product showed that the reaction product had a weight average molecular weight of 680, as determined using a conversion calibration curve obtained from the standard polystyrene. The obtained reaction product is presumed to be a compound having structural unit represented by the following formula (5).

Crosslinking Agent Synthesis Example 1

20.00 g of glycidyl methacrylate (Tokyo Chemical Industry Co., Ltd.) and 1.00 g of dimethyl 2,2'-azobis(isobutyrate) (FUJIFILM Wako Pure Chemical Corporation) were dissolved in 21.00 g of propylene glycol monomethyl ether acetate (hereinafter, abbreviated to "PGMEA" in the present specification). The solution was then added to 28.00 g of PGMEA heated and maintained at 100° C., and allowed to react for 24 hours, obtaining a solution containing a reaction product. The obtained solution was subjected to reprecipitation using methanol (630 g; manufactured by Kanto Chemical Co., Inc.). The resultant precipitate was subjected to filtration, and dried by means of a vacuum dryer at 60° C. for 24 hours to obtain an intended polymer.

A GPC analysis made with respect to the obtained reaction product showed that the reaction product had a weight average molecular weight of 8,100, as determined using a conversion calibration curve obtained from the standard polystyrene. The obtained reaction product is presumed to be a polymer having structural units represented by the following formula (6).

[Formula 21]

(5)

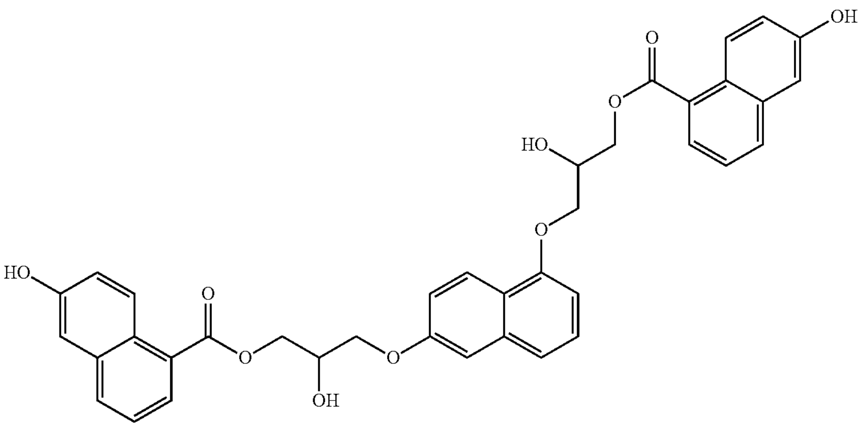

[Formula 22]

(6)

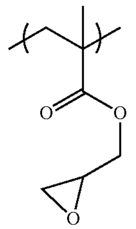

[Preparation of a Resist Underlayer Film-Forming Composition]

Example 1

Into 6.38 g of a solution (solvent: PGME which is the same solvent as used in the synthesis; solid content: 25.94% by mass) containing 1.66 g of the compound obtained in Synthesis Example 1 were mixed 2.31 g of a solution (solvent: PGMEA; solid content: 32.20% by mass) containing 0.74 g of the polymer obtained in Crosslinking Agent Synthesis Example 1, 3.56 g of PGME, 17.70 g of PGMEA, and 0.050 g of a 1% by mass PGMEA solution of a surfactant (trade name: R-40; manufactured by DIC Corporation) to obtain a 8.0% by mass solution. The obtained solution was subjected to filtration using a polytetrafluoroethylene microfilter having a pore diameter of 0.2 μm to prepare a resist underlayer film-forming composition.

Example 2

Into 4.45 g of a solution (solvent: PGME which is the same solvent as used in the synthesis; solid content: 26.05% by mass) containing 1.16 g of the compound obtained in Synthesis Example 2 were mixed 1.62 g of a solution (solvent: PGMEA; solid content: 32.20% by mass) containing 0.52 g of the polymer obtained in Crosslinking Agent Synthesis Example 1, 2.21 g of PGME, 12.44 g of PGMEA, and 0.035 g of a 1% by mass PGMEA solution of a surfactant (trade name: R-40; manufactured by DIC Corporation) to obtain a 8.4% by mass solution. The obtained solution was subjected to filtration using a polytetrafluoroethylene microfilter having a pore diameter of 0.2 μm to prepare a resist underlayer film-forming composition.

Example 3

Into 5.59 g of a solution (solvent: PGME which is the same solvent as used in the synthesis; solid content: 25.92% by mass) containing 1.45 g of the compound obtained in Synthesis Example 3 were mixed 2.02 g of a solution (solvent: PGMEA; solid content: 32.20% by mass) containing 0.65 g of the polymer obtained in Crosslinking Agent Synthesis Example 1, 2.73 g of PGME, 14.62 g of PGMEA, and 0.043 g of a 1% by mass PGMEA solution of a surfactant (trade name: R-40; manufactured by DIC Corporation) to obtain a 8.4% by mass solution. The obtained solution was subjected to filtration using a polytetrafluoroethylene microfilter having a pore diameter of 0.2 μm to prepare a resist underlayer film-forming composition.

Example 4

Into 5.95 g of a solution (solvent: PGME which is the same solvent as used in the synthesis; solid content: 24.35% by mass) containing 1.45 g of the compound obtained in Synthesis Example 4 were mixed 2.02 g of a solution (solvent: PGMEA; solid content: 32.20% by mass) containing 0.65 g of the polymer obtained in Crosslinking Agent Synthesis Example 1, 2.37 g of PGME, 14.62 g of PGMEA, and 0.043 g of a 1% by mass PGMEA solution of a surfactant (trade name: R-40; manufactured by DIC Corporation) to obtain a 8.4% by mass solution. The obtained solution was subjected to filtration using a polytetrafluoroethylene microfilter having a pore diameter of 0.2 μm to prepare a resist underlayer film-forming composition.

Example 5

Into 5.87 g of a solution (solvent: PGME which is the same solvent as used in the synthesis; solid content: 24.67% by mass) containing 1.45 g of the compound obtained in Synthesis Example 5 were mixed 2.02 g of a solution (solvent: PGMEA; solid content: 32.20% by mass) containing 0.65 g of the polymer obtained in Crosslinking Agent Synthesis Example 1, 2.45 g of PGME, 14.62 g of PGMEA, and 0.043 g of a 1% by mass PGMEA solution of a surfactant (trade name: R-40; manufactured by DIC Corporation) to obtain a 8.4% by mass solution. The obtained solution was subjected to filtration using a polytetrafluoroethylene microfilter having a pore diameter of 0.2 μm to prepare a resist underlayer film-forming composition.

Comparative Example 1

Into 0.87 g of trade name: TEP-TPA (formula (7) below; manufactured by Asahi Yukizai Corporation) were mixed 1.21 g of a solution (solvent: PGMEA; solid content: 32.20% by mass) containing 0.39 g of the polymer obtained in Crosslinking Agent Synthesis Example 1, 4.12 g of PGME, 8.77 g of PGMEA, and 0.026 g of a 1% by mass PGMEA solution of a surfactant (trade name: R-40; manufactured by DIC Corporation) to obtain a 8.4% by mass solution. The obtained solution was subjected to filtration using a polytetrafluoroethylene microfilter having a pore diameter of 0.2 μm to prepare a resist underlayer film-forming composition.

[Formula 23]

(7)

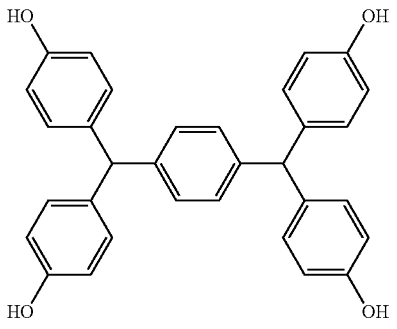

Comparative Example 2

Into 0.87 g of trade name: TEP-DF (formula (8) below; manufactured by Asahi Yukizai Corporation) were mixed 1.21 g of a solution (solvent: PGMEA; solid content: 32.20% by mass) containing 0.39 g of the polymer obtained in Crosslinking Agent Synthesis Example 1, 4.12 g of PGME, 8.77 g of PGMEA, and 0.026 g of a 1% by mass PGMEA solution of a surfactant (trade name: R-40; manufactured by DIC Corporation) to obtain a 8.4% by mass solution. The obtained solution was subjected to filtration using a polytetrafluoroethylene microfilter having a pore diameter of 0.2 μm to prepare a resist underlayer film-forming composition.

[Formula 24]

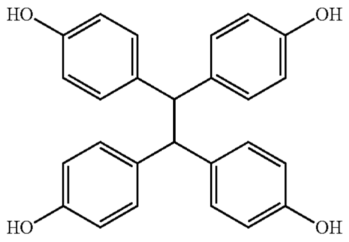

(8)

Comparative Example 3

Into 2.99 g of a solution (solvent: PGMEA; solid content: 29.10% by mass) containing 0.87 g of trade name: GNC-8 (formula (9) below; manufactured by Gunei Chemical Industry Co., Ltd.) were mixed 1.21 g of a solution (solvent: PGMEA; solid content: 32.20% by mass) containing 0.39 g of the polymer obtained in Crosslinking Agent Synthesis Example 1, 4.12 g of PGME, 6.65 g of PGMEA, and 0.026 g of a 1% by mass PGMEA solution of a surfactant (trade name: R-40; manufactured by DIC Corporation) to obtain a 8.4% by mass solution. The obtained solution was subjected to filtration using a polytetrafluoroethylene microfilter having a pore diameter of 0.2 μm to prepare a resist underlayer film-forming composition.

[Formula 25]

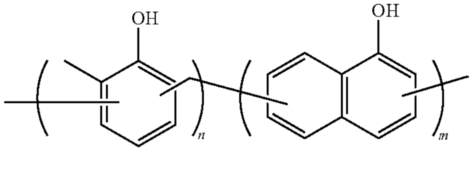

(9)

[Test for Dissolution]

Each of the resist underlayer film-forming compositions prepared in Examples 1 to 5 and Comparative Examples 1 to 3 was checked whether they had an insoluble material. In the case where no insoluble material was found in the composition, the result was indicated using symbol "○" in Table 1 below. With respect to the resist underlayer film-forming composition in Comparative Example 2, an insoluble material was found at the time of preparing the composition, and therefore no further evaluation was conducted.

[Test for Dissolution into a Photoresist Solvent]

Each of the resist underlayer film-forming compositions prepared in Examples 1 to 5 and Comparative Examples 1 and 3 was applied by a spinner onto a silicon wafer. Then, the resultant applied film was baked on a hotplate at the temperature shown in Table 1 below for one minute to form a resist underlayer film (thickness: 0.2 μm). The formed resist underlayer film was immersed in a PGME/PGMEA mixed solvent (PGME/PGMEA mixing ratio, in terms of a mass, is 70/30), which is a solvent used in the photoresist solution, to confirm that the film was insoluble in the solvent, and the results are shown using symbol "○" in Table 1 below.

[Test for Optical Parameter]

Each of the resist underlayer film-forming compositions prepared in Examples 1 to 5 and Comparative Examples 1 and 3 was applied by a spinner onto a silicon wafer. Then, the resultant applied film was baked on a hotplate at the temperature shown in Table 1 below for one minute to form a resist underlayer film (thickness: 0.2 μm). With respect to the formed resist underlayer film, using a spectroscopic ellipsometer (VUV-VASE VU-302, manufactured by J. A. Woollam Co., Inc.), a refractive index (n value) and an attenuation coefficient (k value) at a wavelength of 193 nm were measured. The results are shown in Table 1 below. For achieving satisfactory antireflection ability, the k value of the resist underlayer film at a wavelength of 193 nm is desirably not less than 0.1 and not more than 0.5.

TABLE 1

| | Baking temperature (deg. C.) | Dissolution PGME/PGMEA 30/70 | Solvent resistance PGME/PGMEA 70/30 | Optical parameter 193 nm n value | Optical parameter 193 nm k value | Planarization |
|---|---|---|---|---|---|---|
| Example 1 | 250 | ○ | ○ | 1.50 | 0.14 | ○ |
| Example 2 | 250 | ○ | ○ | 1.54 | 0.15 | ○ |
| Example 3 | 250 | ○ | ○ | 1.51 | 0.17 | ○ |
| Example 4 | 250 | ○ | ○ | 1.49 | 0.16 | ○ |
| Example 5 | 250 | ○ | ○ | 1.50 | 0.18 | ○ |
| Comparative Example 1 | 250 | ○ | ○ | 1.52 | 0.70 | × |
| Comparative Example 2 | 250 | × | — | — | — | — |
| Comparative Example 3 | 250 | ○ | ○ | 1.48 | 0.30 | × |

[Test for Coverage for a Stepped Substrate]

As evaluation of the properties of planarization, using an $SiO_2$ substrate having a thickness of 100 nm, a comparison was made between the coating film thickness on the dense area (DENSE) having a trench width of 10 nm and a pitch of 100 nm and the coating film thickness on the iso-trench pattern area (ISO) having a trench width of 100 nm and a pitch of 10 μm. Each of the resist underlayer film-forming compositions in Examples 1 to 5 and Comparative Examples 1 and 3 was applied onto the above-mentioned substrate so as to have a thickness of 240 nm, and then baked on a hotplate at the temperature shown in Table 1 above for one minute to form a resist underlayer film (thickness: 0.24 μm). The step coverage for the substrate was examined using a scanning electron microscope (S-4800), manufactured by Hitachi High-Technologies Corporation, and the properties of planarization were evaluated by measuring a difference in the thickness of the film between the dense area (pattern portion) and the iso-trench pattern area of the stepped substrate (wherein the difference in the thickness of the film corresponds to a coat step between the dense area and the iso-trench pattern area, which is called bias). The values of the thickness of the film in each area and the coat step are shown in Table 2. In the evaluation of the planarization properties, the smaller the bias value, the better the planarization properties. In Table 1 above, the result in which the coat step was less than 50 nm was indicated using symbol "○", and the result in which the coat step was 50 nm or more was indicated using symbol "x".

TABLE 2

| | Trench Thickness (nm) | Iso Thickness (nm) | Trench/Iso Coat step (nm) |
|---|---|---|---|
| Example 1 | 238 | 214 | 24 |
| Example 2 | 240 | 206 | 34 |
| Example 3 | 240 | 198 | 42 |
| Example 4 | 236 | 210 | 26 |
| Example 5 | 240 | 200 | 40 |
| Comparative Example 1 | 244 | 194 | 50 |
| Comparative Example 2 | — | — | — |
| Comparative Example 3 | 238 | 181 | 57 |

Comparison of the planarization properties reveals that the results in Examples 1 to 5 show that the coat step between the dense area and the iso-trench pattern area is smaller than the results in Comparative Examples 1 and 3. From this, it can be said that the resist underlayer films obtained from the resist underlayer film-forming compositions in Examples 1 to 5 have excellent planarization properties.

INDUSTRIAL APPLICABILITY

The resist underlayer film-forming composition of the present invention exhibits a high reflow property in the baking step after applied to a substrate, and therefore can be applied even onto a stepped substrate flatly and enables formation of a flat film. Further, the resist underlayer film-forming composition of the present invention has an appropriate antireflection effect, and therefore is useful as a resist underlayer film-forming composition.

The invention claimed is:

1. A method for producing a semiconductor device, comprising the steps of:

forming a resist underlayer film on a stepped semiconductor substrate using a resist underlayer film-forming composition comprising at least one compound represented by the following formula (A), at least one polymer consisting of unit structures represented by the following formula (B), and a solvent:

(A)

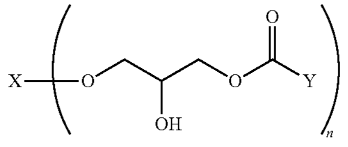

wherein X represents an n-valent organic group having 2 to 50 carbon atoms, each of n quantity of Y independently represents an aromatic hydrocarbon group having 6 to 60 carbon atoms and having at least one hydroxy group, and n represents an integer of 1 to 4, (B)

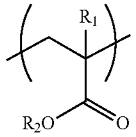

wherein $R_1$ represents a hydrogen atom or a methyl group, and $R_2$ represents at least one group selected from the following formulae (B-1) to (B-3):

(B-1)

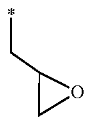

(B-2)

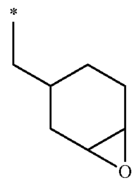

(B-3)

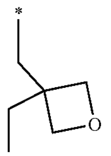

wherein, in formulae (B-1) to (B-3), * represents a bonding site to the adjacent oxygen atom;

forming a resist film on the formed resist underlayer film;

irradiating the formed resist film with a light or an electron beam and subjecting the resultant resist film to development to form a resist pattern;

etching the resist underlayer film through the formed resist pattern to form a patterned resist underlayer film; and processing the stepped semiconductor substrate through the patterned resist underlayer film, wherein the processing is conducted by dry etching.

2. The method for producing the semiconductor device according to claim 1, wherein the resist underlayer film is a baked product of an applied film comprising the resist underlayer film-forming composition.

3. A method for producing a stepped semiconductor device, comprising the steps of:

forming a resist underlayer film on a stepped semiconductor substrate using a resist underlayer film-forming composition comprising at least one compound represented by the following formula (A), at least one polymer consisting of unit structures represented by the following formula (B), and a solvent:

(A)

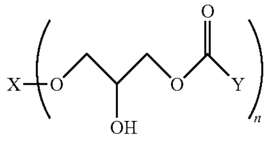

wherein X represents an n-valent organic group having 2 to 50 carbon atoms, and has at least one benzene ring, naphthalene ring, anthracene ring, or pyrene ring or a combination thereof, each of n quantity of Y independently represents an aromatic hydrocarbon group having 6 to 60 carbon atoms and having at least one hydroxy group, and n represents an integer of 1 to 4, (B)

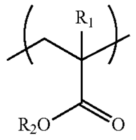

wherein $R_1$ represents a hydrogen atom or a methyl group, and $R_2$ represents at least one group selected from the following formulae (B-1) to (B-3):

(B-1)

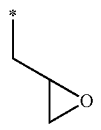

(B-2)

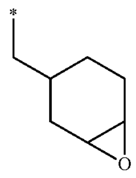

(B-3)

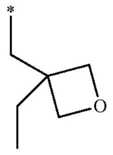

wherein, in formulae (B-1) to (B-3), * represents a bonding site to the adjacent oxygen atom;

forming a resist film on the formed resist underlayer film;

irradiating the formed resist film with a light or an electron beam and subjecting the resultant resist film to development to form a resist pattern;

etching the resist underlayer film through the formed resist pattern to form a patterned resist underlayer film; and processing the stepped semiconductor substrate through the patterned resist underlayer film, wherein the processing is conducted by dry etching.

4. The method for producing the semiconductor device according to claim 3, wherein the resist underlayer film is a baked product of an applied film comprising the resist underlayer film-forming composition.

5. A method for producing a stepped semiconductor device, comprising the steps of:

forming a resist underlayer film on a stepped semiconductor substrate using a resist underlayer film-forming composition comprising at least one compound represented by the following formula (A), at least one polymer consisting of unit structures represented by the following formula (B), and a solvent:

(A)

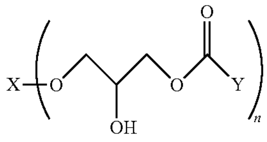

wherein X represents an n-valent organic group having 2 to 50 carbon atoms, each of n quantity of Y independently represents an aromatic hydrocarbon group having 6 to 60 carbon atoms and has a benzene ring, a naphthalene ring, an anthracene ring, or a pyrene ring, each having at least one hydroxy group, or a combination thereof, and n represents an integer of 1 to 4, (B)

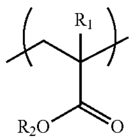

wherein $R_1$ represents a hydrogen atom or a methyl group, and $R_2$ represents at least one group selected from the following formulae (B-1) to (B-3):

(B-1)

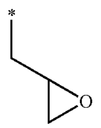

(B-2)

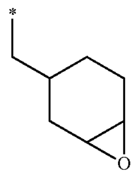

-continued (B-3)

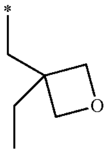

wherein, in formulae (B-1) to (B-3), * represents a bonding site to the adjacent oxygen atom;

forming a resist film on the formed resist underlayer film;

irradiating the formed resist film with a light or an electron beam and subjecting the resultant resist film to development to form a resist pattern;

etching the resist underlayer film through the formed resist pattern to form a patterned resist underlayer film; and processing the stepped semiconductor substrate through the patterned resist underlayer film, wherein the processing is conducted by dry etching.

6. The method for producing the semiconductor device according to claim 5, wherein the resist underlayer film is a baked product of an applied film comprising the resist underlayer film-forming composition.

7. A method for producing a stepped semiconductor device, comprising the steps of:

forming a resist underlayer film on a stepped semiconductor substrate using a resist underlayer film-forming composition comprising at least one compound represented by the following formula (A), at least one polymer consisting of unit structures represented by the following formula (B), and a solvent:

(A)

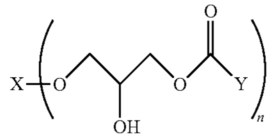

wherein X represents an n-valent organic group having 2 to 50 carbon atoms, each of n quantity of Y independently represents an aromatic hydrocarbon group having 6 to 60 carbon atoms and having at least one hydroxy group, and n is 2, (B)

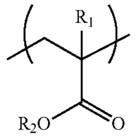

wherein $R_1$ represents a hydrogen atom or a methyl group, and $R_2$ represents at least one group selected from the following formulae (B-1) to (B-3):

(B-1)

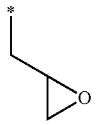

-continued (B-2)

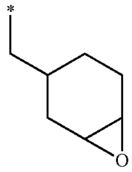

(B-3)

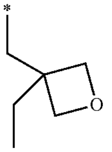

wherein, in formulae (B-1) to (B-3), * represents a bonding site to the adjacent oxygen atom;

forming a resist film on the formed resist underlayer film;

irradiating the formed resist film with a light or an electron beam and subjecting the resultant resist film to development to form a resist pattern;

etching the resist underlayer film through the formed resist pattern to form a patterned resist underlayer film; and processing the stepped semiconductor substrate through the patterned resist underlayer film, wherein the processing is conducted by dry etching.

8. The method for producing the semiconductor device according to claim 7, wherein the resist underlayer film is a baked product of an applied film comprising the resist underlayer film-forming composition.

9. A method for producing a stepped semiconductor device, comprising the steps of:

forming a resist underlayer film on a stepped semiconductor substrate using a resist underlayer film-forming composition comprising at least one compound represented by the following formula (A), at least one polymer consisting of unit structures represented by the following formula (B), and a solvent having a boiling point of 160° C. or higher:

(A)

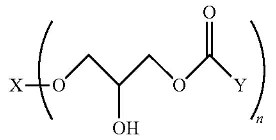

wherein X represents an n-valent organic group having 2 to 50 carbon atoms, each of n quantity of Y independently represents an aromatic hydrocarbon group having 6 to 60 carbon atoms and having at least one hydroxy group, and n represents an integer of 1 to 4, (B)

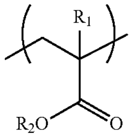

wherein $R_1$ represents a hydrogen atom or a methyl group, and $R_2$ represents at least one group selected from the following formulae (B-1) to (B-3):

(B-1)

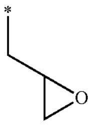

(B-2)

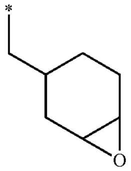

-continued (B-3)

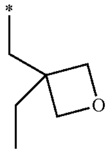

wherein, in formulae (B-1) to (B-3), * represents a bonding site to the adjacent oxygen atom;

forming a resist film on the formed resist underlayer film;

irradiating the formed resist film with a light or an electron beam and subjecting the resultant resist film to development to form a resist pattern;

etching the resist underlayer film through the formed resist pattern to form a patterned resist underlayer film; and processing the stepped semiconductor substrate through the patterned resist underlayer film, wherein the processing is conducted by dry etching.

10. The method for producing the semiconductor device according to claim 9, wherein the resist underlayer film is a baked product of an applied film comprising the resist underlayer film-forming composition.

* * * * *